United States Patent
Chen et al.

(10) Patent No.: US 12,557,331 B2
(45) Date of Patent: Feb. 17, 2026

(54) TRANSISTOR STRUCTURE

(71) Applicant: United Microelectronics Corp., Hsinchu (TW)

(72) Inventors: Hsuan-Kai Chen, Taichung (TW); Tun-Jen Cheng, Hsinchu (TW); Ching-Chung Yang, Hsinchu (TW); Nien-Chung Li, Hsinchu (TW); Wen-Fang Lee, Hsinchu (TW); Chiu-Te Lee, Hsinchu County (TW)

(73) Assignee: United Microelectronics Corp., Hsinchu (TW)

( * ) Notice: Subject to any disclaimer, the term of this patent is extended or adjusted under 35 U.S.C. 154(b) by 388 days.

(21) Appl. No.: 18/459,454

(22) Filed: Sep. 1, 2023

(65) Prior Publication Data

US 2025/0048671 A1    Feb. 6, 2025

(30) Foreign Application Priority Data

Aug. 3, 2023   (CN) .......................... 202310971919.4

(51) Int. Cl.
*H10D 30/65* (2025.01)
*H10D 64/00* (2025.01)
*H10D 64/27* (2025.01)

(52) U.S. Cl.
CPC ........... *H10D 30/65* (2025.01); *H10D 64/111* (2025.01); *H10D 64/516* (2025.01)

(58) Field of Classification Search
CPC .............. H10D 64/111; H10D 64/516; H10D 30/0221; H10D 62/116; H10D 30/603; H10D 64/017; H10D 30/0281–0289; H10D 30/65–659; H10D 30/0273; H10D 30/68–689

See application file for complete search history.

(56) References Cited

U.S. PATENT DOCUMENTS

| | | | |
|---|---|---|---|
| 9,490,360 B2 | 11/2016 | Chen et al. | |
| 9,722,072 B2 | 8/2017 | Chang et al. | |
| 10,727,300 B2 | 7/2020 | Kim et al. | |
| 2020/0035826 A1* | 1/2020 | Ng | H10D 62/393 |
| 2020/0335623 A1* | 10/2020 | Shin | H10D 62/153 |
| 2021/0005747 A1* | 1/2021 | Wu | H10D 30/65 |

* cited by examiner

*Primary Examiner* — Shahed Ahmed
(74) *Attorney, Agent, or Firm* — JCIPRNET

(57) ABSTRACT

A transistor structure including a substrate, a gate dielectric layer, a gate, a first doped region, a second doped region, a first drift region, and a dummy gate is provided. The gate dielectric layer is located on the substrate. The gate dielectric layer includes first and second portions. The second portion is connected to the first portion. The thickness of the second portion is greater than the thickness of the first portion. The gate is located on the first and second portions. The first doped region and the second doped region are located in the substrate on two sides of the gate dielectric layer. The first drift region is located in the substrate on one side of the gate. The second doped region is located in the first drift region. The dummy gate is located on the second portion between the gate and the second doped region.

20 Claims, 2 Drawing Sheets

TRANSISTOR STRUCTURE

CROSS-REFERENCE TO RELATED APPLICATION

This application claims the priority benefit of China application serial no. 202310971919.4, filed on Aug. 3, 2023. The entirety of the above-mentioned patent application is hereby incorporated by reference herein and made a part of this specification.

BACKGROUND

Technical Field

The invention relates to a semiconductor structure, and particularly relates to a transistor structure.

Description of Related Art

The transistor structure is widely used in various electronic products. However, how to further reduce the size of the transistor structure and further improve the electrical performance of the transistor structure is the goal of continuous efforts.

SUMMARY

The invention provides a transistor structure, which can have the smaller size and the better electrical performance.

The invention provides a transistor structure, which includes a substrate, a gate dielectric layer, a gate, a first doped region, a second doped region, a first drift region, and a dummy gate. The gate dielectric layer is located on the substrate. The gate dielectric layer includes a first portion and a second portion. The second portion is connected to the first portion. The thickness of the second portion is greater than the thickness of the first portion. The gate is located on the first portion and the second portion. The first doped region and the second doped region are located in the substrate on two sides of the gate dielectric layer. The first drift region is located in the substrate on one side of the gate. The second doped region is located in the first drift region. The dummy gate is located on the second portion between the gate and the second doped region.

According to an embodiment of the invention, in the transistor structure, the second portion may be embedded in the substrate.

According to an embodiment of the invention, in the transistor structure, the bottom surface of the second portion may be lower than the bottom surface of the first portion. The top surface of the second portion may be coplanar with the top surface of the first portion.

According to an embodiment of the invention, in the transistor structure, the bottom surface of the gate dielectric layer may include a stepped profile. The bottom surface of the gate may be a flat surface. The gate may be a metal gate.

According to an embodiment of the invention, in the transistor structure, the top surface of the second portion may be higher than the top surface of the first portion. The bottom surface of the second portion may be coplanar with the bottom surface of the first portion.

According to an embodiment of the invention, in the transistor structure, the top surface of the gate dielectric layer may include a stepped profile. The bottom surface of the gate may include a stepped profile. The gate may be a polysilicon gate.

According to an embodiment of the invention, in the transistor structure, the first portion and the second portion may be integrally formed.

According to an embodiment of the invention, in the transistor structure, a portion of the first drift region may be located directly below the second portion.

According to an embodiment of the invention, in the transistor structure, a portion of the first drift region may be located directly below the dummy gate.

According to an embodiment of the invention, in the transistor structure, a portion of the first drift region may be located directly below the gate.

According to an embodiment of the invention, in the transistor structure, the dummy gate may be electrically connected to the second doped region.

According to an embodiment of the invention, in the transistor structure, the dummy gate may be separated from the gate.

According to an embodiment of the invention, the transistor structure may further include a first isolation structure and a second isolation structure. The first isolation structure is located in the substrate. The first doped region may be located between the first isolation structure and the gate. The second isolation structure is located in the substrate. The second doped region may be located between the second isolation structure and the dummy gate.

According to an embodiment of the invention, in the transistor structure, the bottom surface of the first drift region may be lower than the bottom surface of the second isolation structure.

According to an embodiment of the invention, the transistor structure may further include a bulk region. The bulk region is located in the substrate. The first doped region may be located between the bulk region and the gate.

According to an embodiment of the invention, in the transistor structure, the bulk region may be connected to the first doped region.

According to an embodiment of the invention, the transistor structure may further include a second drift region. The second drift region is located in the substrate on another side of the gate. The first doped region may be located in the second drift region.

According to an embodiment of the invention, the transistor structure may further include a first well region and a second well region. The first well region is located in the substrate. The first doped region, the second doped region, and the first drift region may be located in the first well region. The second well region is located in the substrate. The first well region may be located in the second well region.

According to an embodiment of the invention, in the transistor structure, the first well region may have a first conductivity type. The first doped region, the second doped region, the first drift region, and the second well region may have a second conductivity type.

According to an embodiment of the invention, the transistor structure may further include a first metal silicide layer and a second metal silicide layer. The first metal silicide layer is located on the first doped region. The second metal silicide layer is located on the second doped region.

Based on the above description, in the transistor structure according to the invention, the gate dielectric layer includes the first portion and the second portion, and the thickness of the second portion is greater than the thickness of the first portion. In addition, the dummy gate is located on the second portion between the gate and the second doped region. Therefore, the size of the transistor structure can be effectively reduced, and the electrical performance of the transistor structure can be effectively improved (e.g., the breakdown voltage can be increased, the on-current can be increased, and the Kirk effect can be reduced).

In order to make the aforementioned and other objects, features and advantages of the invention comprehensible, several exemplary embodiments accompanied with drawings are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

The embodiments are described in detail below with reference to the accompanying drawings, but the embodiments are not intended to limit the scope of the invention. For the sake of easy understanding, the same components in the following description will be denoted by the same reference symbols. In addition, the drawings are for illustrative purposes only and are not drawn to the original dimensions. In fact, the dimensions of the various features may be arbitrarily increased or reduced for clarity of discussion.

Figure 1:
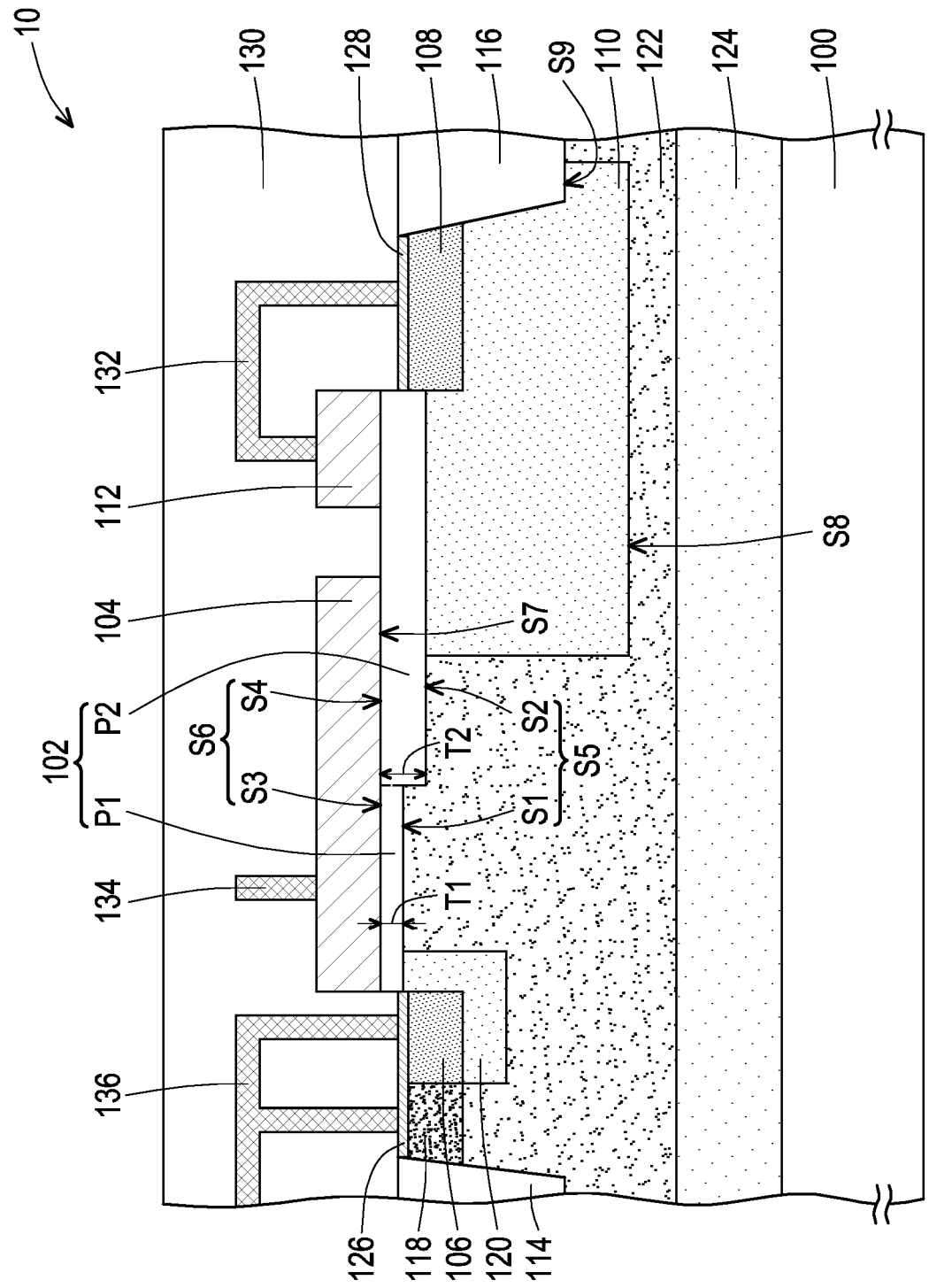
FIG. 1 is a cross-sectional view of a transistor structure according to some embodiments of the invention.

FIG. 1 is a cross-sectional view of a transistor structure according to some embodiments of the invention.

Referring to FIG. 1, a transistor structure 10 includes a substrate 100, a gate dielectric layer 102, a gate 104, a doped region 106, a doped region 108, a drift region 110, and a dummy gate 112. In some embodiments, the transistor structure 10 may be a laterally diffused metal oxide semiconductor (LDMOS) transistor structure. In some embodiments, the substrate 100 may be a semiconductor substrate such as a silicon substrate. In some embodiments, the substrate 100 may have a first conductivity type (e.g., P-type).

Hereinafter, the first conductivity type and the second conductivity type may be one and the other of a P-type conductivity type and an N-type conductivity type, respectively. That is, the first conductivity type and the second conductivity type are different conductivity types. In the present embodiment, the first conductivity type may be a P-type conductivity type, and the second conductivity type may be an N-type conductivity type, but the invention is not limited thereto. In other embodiments, the first conductivity type may be an N-type conductivity type, and the second conductivity type may be a P-type conductivity type.

The gate dielectric layer 102 is located on the substrate 100. The gate dielectric layer 102 includes a first portion P1 and a second portion P2. The second portion P2 is connected to the first portion P1. The thickness T2 of the second portion P2 is greater than the thickness T1 of the first portion P1. The first portion P1 and the second portion P2 may be integrally formed. In the present embodiment, the second portion P2 may be embedded in the substrate 100. The bottom surface S2 of the second portion P2 may be lower than the bottom surface S1 of the first portion P1. The top surface S4 of the second portion P2 may be coplanar with the top surface S3 of the first portion P1. The bottom surface S5 of the gate dielectric layer 102 may include the bottom surface S1 and the bottom surface S2. The bottom surface S5 of the gate dielectric layer 102 may include a stepped profile. The top surface S6 of the gate dielectric layer 102 may include the top surface S3 and the top surface S4. The top surface S6 of the gate dielectric layer 102 may be a flat surface. In some embodiments, the material of the gate dielectric layer 102 is, for example, silicon oxide.

The gate 104 is located on the first portion P1 and the second portion P2. The bottom surface S7 of the gate 104 may be a flat surface. In the present embodiment, the gate 104 may be a metal gate.

The doped region 106 and the doped region 108 are located in the substrate 100 on two sides of the gate dielectric layer 102. In some embodiments, the doped region 106 may be used as a source, and the doped region 108 may be used as a drain. In some embodiments, the doped region 106 and the doped region 108 may have the second conductivity type (e.g., N type).

The drift region 110 is located in the substrate 100 on one side of the gate 104. The doped region 108 is located in the drift region 110. In some embodiments, a portion of the drift region 110 may be located directly below the second portion P2. In some embodiments, a portion of the drift region 110 may be located directly below the gate 104. In some embodiments, the drift region 110 may have the second conductivity type (e.g., N type).

The dummy gate 112 is located on the second portion P2 between the gate 104 and the doped region 108. The dummy gate 112 may be separated from the gate 104. In some embodiments, the dummy gate 112 may be electrically connected to the doped region 108. In some embodiments, a portion of the drift region 110 may be located directly below the dummy gate 112. In the present embodiment, the dummy gate 112 may be a metal gate.

The transistor structure 10 may further include an isolation structure 114 and an isolation structure 116. The isolation structure 114 is located in the substrate 100. The doped region 106 may be located between the isolation structure 114 and the gate 104. The isolation structure 116 is located in the substrate 100. The doped region 108 may be located between the isolation structure 116 and the dummy gate 112. In some embodiments, the bottom surface S8 of the drift region 110 may be lower than the bottom surface S9 of the isolation structure 116. In some embodiments, the isolation structure 114 and the isolation structure 116 may be shallow trench isolation (STI) structures. In some embodiments, the material of the isolation structure 114 and the material of the isolation structure 116 are, for example, silicon oxide.

The transistor structure 10 may further include a bulk region 118. The bulk region 118 is located in the substrate 100. The doped region 106 may be located between the bulk region 118 and the gate 104. In some embodiments, the bulk region 118 may be connected to the doped region 106. In some embodiments, the bulk region 118 may have the first conductivity type (e.g., P-type).

The transistor structure 10 may further include a drift region 120. The drift region 120 is located in the substrate 100 on another side of the gate 104. The doped region 106 may be located in the drift region 120. In some embodiments, a portion of the drift region 120 may be located directly below the first portion P1. In some embodiments, a portion of the drift region 120 may be located directly below the gate 104. In some embodiments, the drift region 120 may have the second conductivity type (e.g., N type).

The transistor structure 10 may further include a well region 122 and a well region 124. The well region 122 is located in the substrate 100. The doped region 106, the doped region 108, the drift region 110, the bulk region 118, and the drift region 120 may be located in the well region 122. The well region 124 is located in the substrate 100. The well region 122 may be located in the well region 124. In some embodiments, the well region 122 may have the first conductivity type (e.g., P type), and the well region 124 may have the second conductivity type (e.g., N type).

The transistor structure 10 may further include a metal silicide layer 126 and a metal silicide layer 128. The metal silicide layer 126 is located on the doped region 106. The metal silicide layer 126 may be further located on the bulk region 118. The metal silicide layer 128 is located on the doped region 108. In some embodiments, the material of the metal silicide layer 126 and the material of the metal silicide layer 128 are, for example, cobalt silicide (CoSi) or nickel silicide (NiSi).

The transistor structure 10 may further include a dielectric layer 130. The dielectric layer 130 is located on the substrate 100 and covers the dielectric layer 102, the gate 104, the dummy gate 112, the isolation structure 114, the isolation structure 116, the metal silicide layer 126, and the metal silicide layer 128. In some embodiments, the dielectric layer 130 may be a multilayer structure. In some embodiments, the material of the dielectric layer 130 is, for example, silicon oxide, silicon nitride, or a combination thereof.

The transistor structure 10 may further include an interconnect structure 132, an interconnect structure 134, and an interconnect structure 136. The interconnect structure 132 is electrically connected to the dummy gate 112 and the doped region 108. In some embodiments, the interconnect structure 132 may be electrically connected to the doped region 108 by the metal silicide layer 128. In some embodiments, the dummy gate 112 may be electrically connected to the doped region 108 by the interconnect structure 132 and the metal silicide layer 128. The interconnect structure 134 is electrically connected to the gate 104. The interconnect structure 136 is electrically connected to the doped region 106 and the bulk region 118. In some embodiments, the interconnect structure 136 may be electrically connected to the doped region 106 and the bulk region 118 by the metal silicide layer 126. In some embodiments, the interconnect structure 132, the interconnect structure 134, and the interconnect structure 136 may include contacts, conductive lines, or a combination thereof. In some embodiments, the material of the interconnect structure 132, the material of the interconnect structure 134, and the material of the interconnect structure 136 are, for example, tungsten, aluminum, copper, titanium, titanium nitride, tantalum, tantalum nitride, or a combination thereof.

Based on the above embodiments, in the transistor structure 10, the gate dielectric layer 102 includes the first portion P1 and the second portion P2, and the thickness T2 of the second portion P2 is greater than the thickness T1 of the first portion P1. In addition, the dummy gate 112 is located on the second portion P2 between the gate 104 and the doped region 108. Therefore, the size of the transistor structure 10 can be effectively reduced, and the electrical performance of the transistor structure 10 can be effectively improved (e.g., the breakdown voltage can be increased, the on-current can be increased, and the Kirk effect can be reduced).

Figure 2:
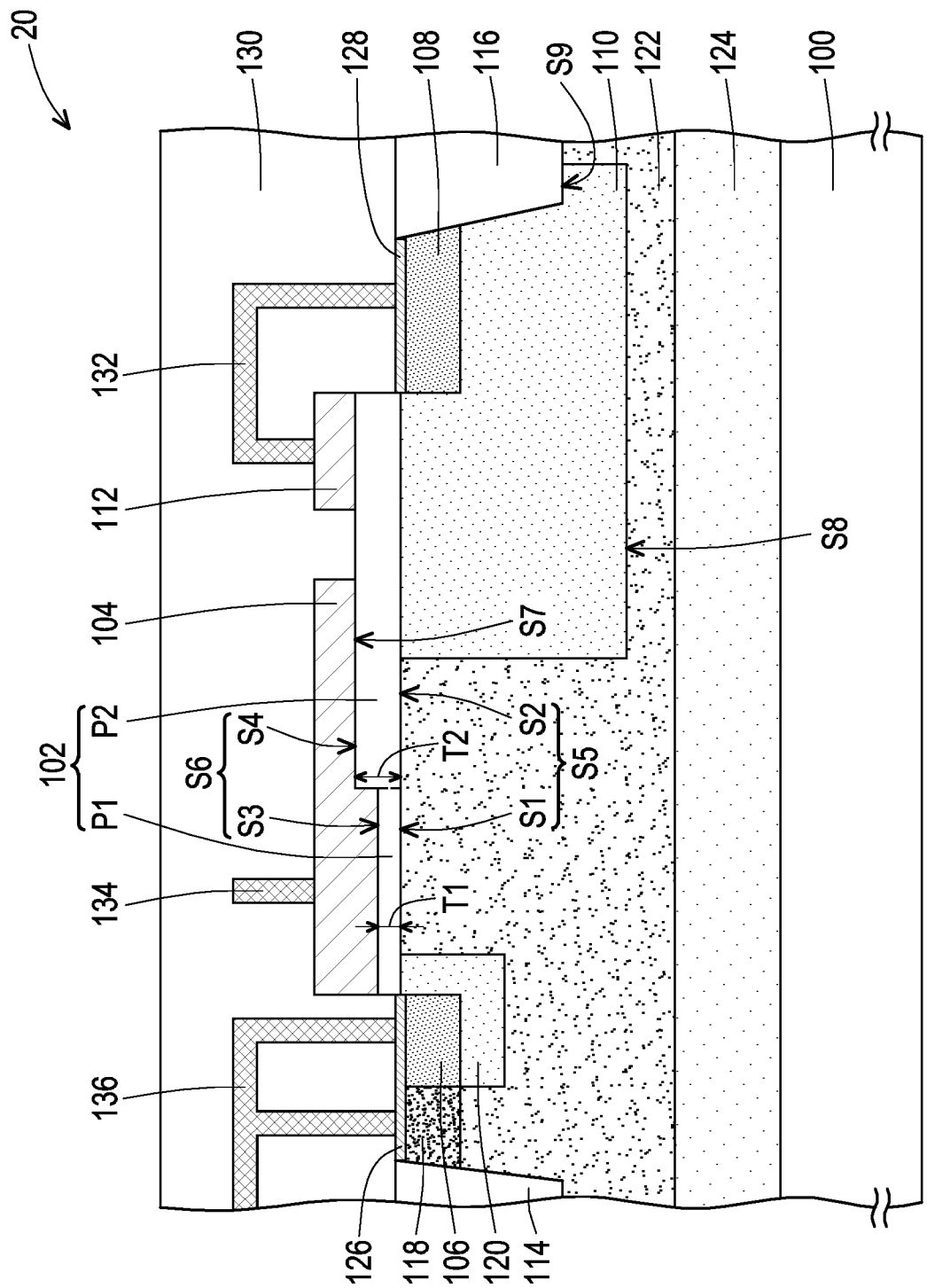
FIG. 2 is a cross-sectional view of a transistor structure according to other embodiments of the invention.

FIG. 2 is a cross-sectional view of a transistor structure according to other embodiments of the invention.

Referring to FIG. 2 and FIG. 1, the difference between a transistor structure 20 of FIG. 2 and the transistor structure 10 of FIG. 1 is as follows. As shown in FIG. 2, in the transistor structure 20, the top surface S4 of the second portion P2 may be higher than the top surface S3 of the first portion P1. In the transistor structure 20, the bottom surface S2 of the second portion P2 may be coplanar with the bottom surface S1 of the first portion P1. In the transistor structure 20, the top surface S6 of the gate dielectric layer 102 may include a stepped profile. In the transistor structure 20, the bottom surface S5 of the gate dielectric layer 102 may be a flat surface. In the transistor structure 20, the bottom surface S7 of the gate 104 may include a stepped profile. In the transistor structure 20, the gate 104 may be a polysilicon gate. In the transistor structure 20, the dummy gate 112 may be a polysilicon gate.

Based on the above embodiments, in the transistor structure 20, the gate dielectric layer 102 includes the first portion P1 and the second portion P2, and the thickness T2 of the second portion P2 is greater than the thickness T1 of the first portion P1. In addition, in the transistor structure 20, the dummy gate 112 is located on the second portion P2 between the gate 104 and the doped region 108. Therefore, the size of the transistor structure 20 can be effectively reduced, and the electrical performance of the transistor structure 20 can be effectively improved (e.g., the breakdown voltage can be increased, the on-current can be increased, and the Kirk effect can be reduced).

In summary, in the transistor structure of the aforementioned embodiment, the gate dielectric layer includes the first portion and the second portion, and the thickness of the second portion is greater than the thickness of the first portion. In addition, the dummy gate is located on the second portion between the gate and the second doped region. Therefore, the size of the transistor structure can be effectively reduced, and the electrical performance of the transistor structure can be effectively improved.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:

1. A transistor structure, comprising:
    a substrate;
    a gate dielectric layer located on the substrate and comprising:
        a first portion; and
        a second portion connected to the first portion, wherein a thickness of the second portion is greater than a thickness of the first portion;
    a gate located on the first portion and the second portion;
    a first doped region and a second doped region located in the substrate on two sides of the gate dielectric layer;
    a first drift region located in the substrate on one side of the gate, wherein the second doped region is located in the first drift region; and
    a dummy gate located on the second portion between the gate and the second doped region.

2. The transistor structure according to claim 1, wherein the second portion is embedded in the substrate.

3. The transistor structure according to claim 1, wherein
    a bottom surface of the second portion is lower than a bottom surface of the first portion, and
    a top surface of the second portion is coplanar with a top surface of the first portion.

4. The transistor structure according to claim 1, wherein
a bottom surface of the gate dielectric layer comprises a stepped profile,
a bottom surface of the gate comprises a flat surface, and the gate comprises a metal gate.

5. The transistor structure according to claim 1, wherein
a top surface of the second portion is higher than a top surface of the first portion, and
a bottom surface of the second portion is coplanar with a bottom surface of the first portion.

6. The transistor structure according to claim 1, wherein
a top surface of the gate dielectric layer comprises a stepped profile
a bottom surface of the gate comprises a stepped profile, and
the gate comprises a polysilicon gate.

7. The transistor structure according to claim 1, wherein the first portion and the second portion are integrally formed.

8. The transistor structure according to claim 1, wherein a portion of the first drift region is located directly below the second portion.

9. The transistor structure according to claim 1, wherein a portion of the first drift region is located directly below the dummy gate.

10. The transistor structure according to claim 1, wherein a portion of the first drift region is located directly below the gate.

11. The transistor structure according to claim 1, wherein the dummy gate is electrically connected to the second doped region.

12. The transistor structure according to claim 1, wherein the dummy gate is separated from the gate.

13. The transistor structure according to claim 1, further comprising:
a first isolation structure located in the substrate, wherein the first doped region is located between the first isolation structure and the gate; and
a second isolation structure located in the substrate, wherein the second doped region is located between the second isolation structure and the dummy gate.

14. The transistor structure according to claim 13, wherein a bottom surface of the first drift region is lower than a bottom surface of the second isolation structure.

15. The transistor structure according to claim 1, further comprising:
a bulk region located in the substrate, wherein the first doped region is located between the bulk region and the gate.

16. The transistor structure according to claim 15, wherein the bulk region is connected to the first doped region.

17. The transistor structure according to claim 1, further comprising:
a second drift region located in the substrate on another side of the gate, wherein the first doped region is located in the second drift region.

18. The transistor structure according to claim 1, further comprising:
a first well region located in the substrate, wherein the first doped region, the second doped region, and the first drift region is located in the first well region; and
a second well region located in the substrate, wherein the first well region is located in the second well region.

19. The transistor structure according to claim 18, wherein the first well region has a first conductivity type, and the first doped region, the second doped region, the first drift region, and the second well region have a second conductivity type.

20. The transistor structure according to claim 1, further comprising:
a first metal silicide layer located on the first doped region; and
a second metal silicide layer located on the second doped region.

* * * * *